(12) United States Patent
Muehlbeyer et al.

(10) Patent No.: US 8,179,621 B2
(45) Date of Patent: May 15, 2012

(54) APPARATUS FOR MANIPULATION OF AN OPTICAL ELEMENT

(75) Inventors: Michael Muehlbeyer, Aalen (DE); Johannes Lippert, Buch am Wald (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 12/716,357

(22) Filed: Mar. 3, 2010

(65) Prior Publication Data
US 2010/0157270 A1    Jun. 24, 2010

Related U.S. Application Data

(63) Continuation of application No. 10/571,708, filed as application No. PCT/EP2004/009941 on Sep. 7, 2004, now abandoned.

(60) Provisional application No. 60/502,334, filed on Sep. 12, 2003.

(51) Int. Cl.
*G02B 7/02* (2006.01)
(52) U.S. Cl. ........................ 359/822; 359/819
(58) Field of Classification Search .................. 359/811, 359/819, 822, 824; 310/12.14, 12.21, 12.24, 310/12.31, 15, 328
See application file for complete search history.

(56) References Cited

U.S. PATENT DOCUMENTS

| | | | |
|---|---|---|---|
| 4,726,671 A | 2/1988 | Ahmad et al. | |
| 5,536,983 A | * 7/1996 | Araki et al. | 310/12.19 |
| 5,986,827 A | 11/1999 | Hale | |
| 6,267,348 B1 | 7/2001 | Perret | |
| 6,327,026 B1 | 12/2001 | Wakui | |
| 6,388,733 B1 | 5/2002 | Hayashi | |
| 6,402,329 B1 | 6/2002 | Bailly et al. | |
| 6,543,740 B2 | 4/2003 | Guant et al. | |
| 6,556,364 B2 | 4/2003 | Meehan et al. | |
| 6,850,675 B1 | 2/2005 | Calvet et al. | |
| 6,864,988 B2 | 3/2005 | Hof et al. | |
| 7,221,463 B2 | 5/2007 | Mizuno | |
| 2002/0180312 A1 | 12/2002 | Tanaka | |
| 2003/0047660 A1 | 3/2003 | Guant et al. | |
| 2003/0058422 A1 | 3/2003 | Loopstra et al. | |
| 2003/0168615 A1 | 9/2003 | Loopstra et al. | |
| 2003/0197914 A1 | 10/2003 | Cox et al. | |

(Continued)

FOREIGN PATENT DOCUMENTS
DE        101 34 387        1/2003
(Continued)

OTHER PUBLICATIONS

Porter Davis et al.; "Second Generation Hybrid D-Strut"; Honeywell Massachusetts Institute of Technology; SPIE Smart Structures and Materials Conference, Feb. 1995, San Diego, CA.

(Continued)

*Primary Examiner* — Ricky Mack
*Assistant Examiner* — Mahidere Sahle
(74) *Attorney, Agent, or Firm* — Fish & Richardson P.C.

(57) ABSTRACT

The invention relates to an apparatus for manipulation of an optical element (7) in up to six degrees of freedom with respect to a structure (8) via at least three actuator devices (9). The actuator devices (9) each have at least two force-controlled actuators, which each produce an effective force along one degree of freedom, with linking points (11) of the actuator devices (9) acting directly on the optical element (7).

36 Claims, 4 Drawing Sheets

U.S. PATENT DOCUMENTS

| | | | |
|---|---|---|---|
| 2004/0017621 A1* | 1/2004 | Suzuki et al. | 359/824 |
| 2004/0095217 A1 | 5/2004 | Loopstra | |
| 2004/0179192 A1 | 9/2004 | Mizuno et al. | |
| 2005/0035684 A1 | 2/2005 | Fuse et al. | |
| 2007/0052301 A1 | 3/2007 | Muehlbeyer et al. | |
| 2007/0284502 A1 | 12/2007 | Hsin et al. | |
| 2009/0027788 A1 | 1/2009 | Knowles et al. | |

FOREIGN PATENT DOCUMENTS

| | | |
|---|---|---|
| EP | 0 642 048 | 3/1995 |
| EP | 1 001 512 | 5/2000 |
| EP | 1 278 089 | 1/2003 |
| EP | 1 312 965 | 5/2003 |
| JP | 10-318728 | 12/1998 |
| JP | 11 274301 | 10/1999 |
| JP | 2000 201471 | 7/2000 |
| JP | 2001 351855 | 12/2001 |
| JP | 2002 359170 | 12/2002 |
| JP | 2003 203860 | 7/2003 |
| JP | 2004-281654 | 10/2004 |
| JP | 2005 064474 | 3/2005 |

OTHER PUBLICATIONS

"Displacement of Piezo Actuators (Stack & contraction Type)"; Piezo-Univeristy; Fundamentals of Piezomechanics; 1996-2008; PI )Phisik Instrumente) GmbH & Co.; found at http://www.physikinstrumente.com/en/products/prdetail.php?sortnr=400300. 20.

English translation of Office Action, of Oct. 5, 2010, for corresponding Japanese Patent application No. JP 2006-525734.

* cited by examiner

APPARATUS FOR MANIPULATION OF AN OPTICAL ELEMENT

CROSS-REFERENCE TO RELATED APPLICATIONS

This application is a continuation of U.S. application Ser. No. 10/571,708, filed Jun. 15, 2006, which is a U.S. National Stage application and claims benefit under 35 USC 371 to PCT Application No. PCT/EP2004/009941, filed Sep. 7, 2004, which claims benefit of U.S. Ser. No. 60/502,334, filed Sep. 12, 2003. The contents of these applications are hereby incorporated by reference in its entirety.

FILED OF THE INVENTION

The invention relates to an apparatus for manipulation of an optical element in up to six degrees of freedom with respect to a structure via at least three actuator devices. The invention likewise relates to an actuator device for direct linking of an optical element or an optical assembly. The invention also relates to an apparatus for manipulation of an optical assembly in up to six degrees of freedom with respect to a structure via at least three actuator devices. Further, the invention relates to a force-controlled actuator and a force-controlled actuator device.

DESCRIPTION OF THE RELATED ART

An apparatus for manipulation of an optical element in up to six degrees of freedom with respect to a structure via at least three actuator devices is known from EP 1 312 965 A1.

Optical elements, in particular mirrors, are mainly manipulated in three degrees of freedom, and piezoactuators, for example, are used for this purpose.

U.S. Pat. No. 5,986,827 discloses a manipulation apparatus for an optical element in three degrees of freedom.

Special applications, such as the accurate positioning of optical elements, of optical assemblies or of a wafer table in projection illumination systems, in particular in the EUVL range, require, however, manipulation or positioning operations in up to six degrees of freedom (both xyz translation and rotation about these axes), with high accuracies at the same time.

Damped force-controlled actuators for damping an optical element in up to six degrees of freedom are known and designated as hybrid actuators. Porter Davis et al. in the article, "Second Generation Hybrid D-Strut"; Honeywell Massachusetts Institute of Technology; SPIE Smart Structures and Materials Conference, February 1995, San Diego, Calif., describes such hybrid actuators. There a Lorentz actuator with a damping system is forming the hybrid actuator. The arrangement of these hybrid actuators in a hexapod configuration is also described. While this configuration focuses the problem of active damping, the present invention relates to actuators or to an actuator system such that almost no parasitic forces are transferred to an optical element, supported or adjusted by the actuators or the actuator system.

The expression degree of freedom should be understood in a mechanical meaning, such that each possibility of cinematic motion of a rigid body is described by an independent coordinate, which represents the respective degree of freedom. Examples for degrees of freedom are translations and rotations as already mentioned.

Actuators which produce movements along one degree of freedom, in particular piezoactuators, are normally linked to the optical element or to the optical assembly, for manipulation. This link must be stiff in the direction of action and must have approximately no stiffness in the remaining degrees of freedom, since the piezoactuator produces displacement forces there. In high-precision applications, this is normally achieved by means of solid body elements, which can introduce undesirable parasitic forces. Sockets are therefore additionally required for compensation purposes, in order to prevent deformations from being transmitted to the optical element or to the optical assembly. Intermediate elements such as these considerably reduce the high degree of stiffness of the bearing required for precise manipulation, thus disadvantageously resulting in it not being possible to achieve the position accuracies required above.

With regard to the general prior art, reference is made to EP 1 001 512 A2, which discloses force-controlled actuators, in particular Lorentz actuators. The Lorentz actuators described there have a permanent magnet which produces a magnetic field in which an element through which current flows is arranged. The resultant Lorentz force is used to produce a movement or a force between moving parts of the Lorentz actuator.

SUMMARY OF THE INVENTION

The present invention is based on the object of providing an apparatus of the type mentioned initially, which allows precise manipulation of optical elements or assemblies in up to six degrees of freedom, with the aid of as far as possible preventing the introduction of undesirable deformations.

According to the invention, this object is achieved in that the actuator devices each have at least two force-controlled actuators, which each produce an effective force in one degree of freedom, with linking points of the actuator devices acting directly on the optical element.

Preferably the effective forces of the actuators of an actuator device are directing in directions of different degrees of freedom of the optical element. Such the effective force of the actuator device, resulting from the forces of the actuators, may be adjusted within a plane, defined by the effective forces of the actuators, by adjusting the individual forces of the actuators of the actuator device.

Further, the effective forces (caused by the actuators of the actuator device) from the actuator device to the optical element at the linking point between the actuator device and the optical element are such that there are almost no forces perpendicular to the effective forces. This is due to the almost vanishing amount of stiffness in this degree of freedom. However, there is maximum stiffness into the direction of the effective force, caused by the actuators of the actuator device. For achieving the stiffness conditions as mentioned, an actuator according to the present invention is a force-controlled actuator, which produces an effective force in one degree of freedom. This actuator comprises a first and a second element. The elements are moveable relative to each other, and the first element and the second element are mechanically decoupled such that only gas or vacuum is between the first and the second element.

Such a force-controlled actuator, preferably a Lorentz based actuator, results in almost no rigidity, and has almost no damping between the elements. This has the advantages that almost no other forces are transferred from the first element to the second element, except the controlled force in the respective degree of freedom of the actuator, e.g. the Lorentz force defined by the direction and the amount of a magnetic field and the direction and amount of an electrical currant.

To form an actuator device according to the present invention, an element of a first force-controlled actuator as described above is coupled via a coupling element to an element of a second force-controlled actuator of the same type. The coupling element can also be an optical element or parts of it, meaning that each actuator of the actuator device is mechanically coupled to the optical element with at least one of its first or second elements. Alternatively a coupling element is directly coupled to the optical element, and each actuator of the actuator device is mechanically coupled to the coupling element with at least one of its first or second element.

In the actuator device according to the present invention, the coupling element is moveable into at least one degree of freedom, if at least one force controlled actuator is actuated. Preferably the coupling element is movable into two degrees of freedom, if both force-controlled actuators of the actuator device are actuated to generate predefined forces.

Further, the linking point of an actuator device can be such that the moving part of the actuators of the actuator device directly contacts the optical element. Here, as already mentioned, the coupling element is the optical element. Preferably the contact is made such that it is essentially a point-like contact, meaning that all actuators of the actuator device affect at the same point of the optical element. However, also other contact geometries are possible like such that the actuators of an actuator device affect at different points of the optical device. If there are more than two actuators in an actuator device, combinations are possible, such that some actuators can affect at the same point and others at other points on the optical element. As mentioned, alternatively or in addition the actuators or at least one actuator of an actuator device can affect to the optical element via a separate coupling element, which is a part of the actuator device, comprising or forming the linking point of the actuator device to the optical element. Preferably the coupling element is connected with two actuators such that a movement (caused by the actuators) of the optical element can be done in a space (usually a sub-space of the space defined by all degrees of freedom) defined by the degrees of freedom of the two actuators of the actuator device. The separate coupling element has the advantage to form a more point-like linking point between the actuator device and the optical element.

Further, according to the invention, the object is likewise achieved by claims 2 and 18. With regard to the actuator device, the object is achieved by claim 33.

The measures according to the invention provide a precise and rapid manipulation capability for optical elements or optical assemblies in up to six degrees of freedom. The use of force-controlled actuators, which essentially allow the remaining degrees of freedom which differ from the direction of action to be unchanged, mean that there is no need for any intermediate flexible elements or sockets in order to compensate for parasitic forces, thus increasing the overall stiffness of the arrangement, e.g. in the direction of the acting force, and improving the position accuracy.

The invention also provides for three actuator devices to be provided, and for the actuator devices each to have at least two force-controlled actuators which each allow one degree of freedom.

Preferably the actuator devices are arranged relative to each other such that the degrees of freedom of at least two actuator devices are linear independent regarding at least two degrees of freedom given by different actuator devices.

These measures result in the optical elements being mounted in an advantageous manner in an arrangement which allows manipulation or positioning in up to six degrees of freedom. The optical element is in this case mounted without an additional socket, that is to say the actuator devices act directly on the optical element.

It is advantageous for the actuator devices to each have a gravity compensation device.

When no current is flowing, no force is produced in the moving parts of the force-controlled actuators. This is a problem in particular in applications in which the actuators have to bear the gravity force of an object, since a permanent current flow is required for this purpose, and heat is thus also produced continuously. This is highly disadvantageous for use in heat-sensitive apparatuses. Gravity compensation prevents the force-controlled actuators which, so to speak, bear the entire mass of the optical element, from having to have current flowing through them permanently. This advantageously reduces the power consumption, and decreases the resultant thermal energy.

In one development of the invention, it is also possible to provide for the plane which is covered by the linking points of the actuator devices to lie at least approximately on the neutral plane of the optical element. Preferably the linking points are defining a plane, which is nearby the neutral plane. The planes preferably are arranged such that the maximum distance of the planes within the optical element is smaller than 20% of the maximum thickness of the optical element.

The surface or face within or outside a stiff body, for example an optical element, is referred to as a neutral plane, in which introduction of forces and moments—for example by means of a manipulator or the like—causes minimal deformations on the optical surface. Analogously, for example, the fiber of a workpiece in which there is no stress when the workpiece is bent is referred to as the neutral fiber. The outer and inner fibers are, in contrast, stretched or compressed during bending. The linking points of the actuator devices act directly—without any intermediate socket—on the optical element, in order now to further improve the bearing or the manipulation of the optical element with respect to deformations that are introduced, and the actuator devices act in an advantageous manner on the neutral plane of the optical element.

In one design refinement of the invention, it is also possible to provide for the actuator devices to be replaced for manufacturing purposes by a passive substitute module, with the gravity force directions and action points in the manufacturing phase and during subsequent use matching.

Since the actuator devices can be replaced by a passive substitute module, the optical element can be designed even during the manufacturing phase on the basis of the same force relationships as during subsequent operation, in particular with regard to compensation for the deformations caused to the optical element by gravity forces. This means that the gravity force during operation is compensated for by a force which acts at an exactly defined point. When an actuator device is replaced by a passive substitute module, the gravity force must once again act at the same point.

It is advantageous for the effective forces of the two force-controlled actuators of the actuator device in each case to pass through a common point, and for the effective force of the gravity compensation device to pass through the common point of the effective forces of the two force-controlled actuators of an actuator device in each case.

In particular, these measures reduce deformations of the optical element caused by moments that are introduced.

Advantages with respect to claims 2, 18 and 33 result analogously to the advantages as already described with reference to claim 1, and from the description.

Advantageous refinements and developments of the invention can be found in the other dependent claims. Exemplary embodiments will be described, in principle, in the following text on the basis of the drawing, in which:

DETAILED DESCRIPTION

Figure 1:
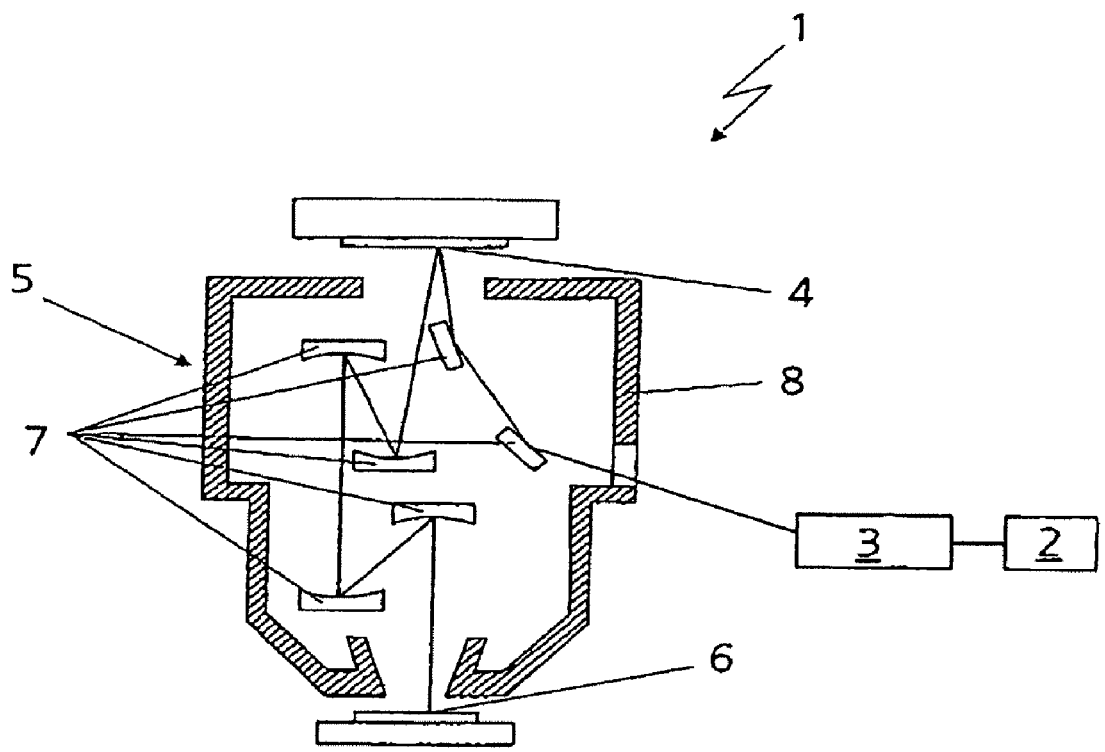
FIG. 1 shows a basic configuration of an EUV projection illumination system with a light source, an illumination system and a projection objective.

As can be seen from FIG. 1, an EUV projection illumination system 1 has a light source 2, an EUV illumination system 3 for illumination of a field on a plane 4 in which a structured mask is arranged, as well as a projection objective 5 for imaging the structured mask in the plane 4 onto a light-sensitive substrate 6. An EUV projection illumination system 1 such as this is known from EP 1 278 089 A2.

A capability is normally required in the projection objective 5 for manipulation of optical elements, such as mirrors 7 or optical assemblies (not illustrated) relative to a housing 8 of the projection objective 5. Appropriate links with actuator devices 9 for the mirrors 7 with respect to the housing 8 of the projection objective 5 are provided for this purpose, (in this context see, in particular, FIGS. 4 and 5). In another exemplary embodiment, the optical elements could also be manipulated relative to a sensor frame or relative to a measurement structure of the projection objective 5. A measurement structure such as this is known from DE 101 34 387 A1.

Figure 2:
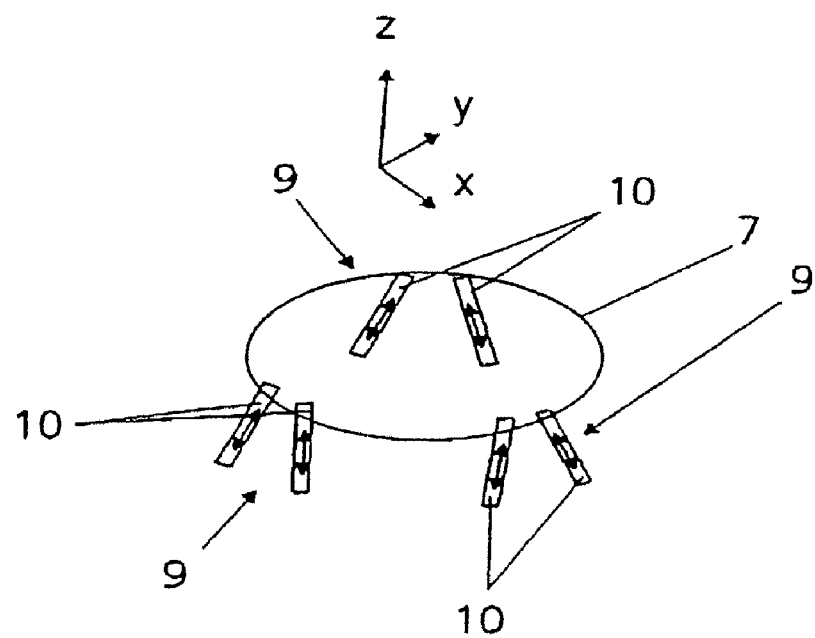
FIG. 2 shows a basic illustration of an apparatus according to the invention for manipulation of an optical element.
Figure 4:
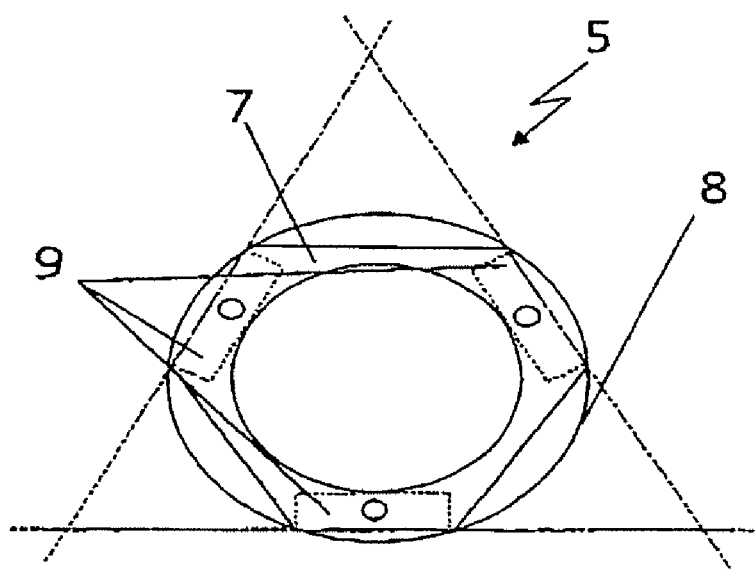
FIG. 4 shows a simplified plan view of an apparatus according to the invention for mounting a mirror in a housing of a projection objective.
Figure 5:
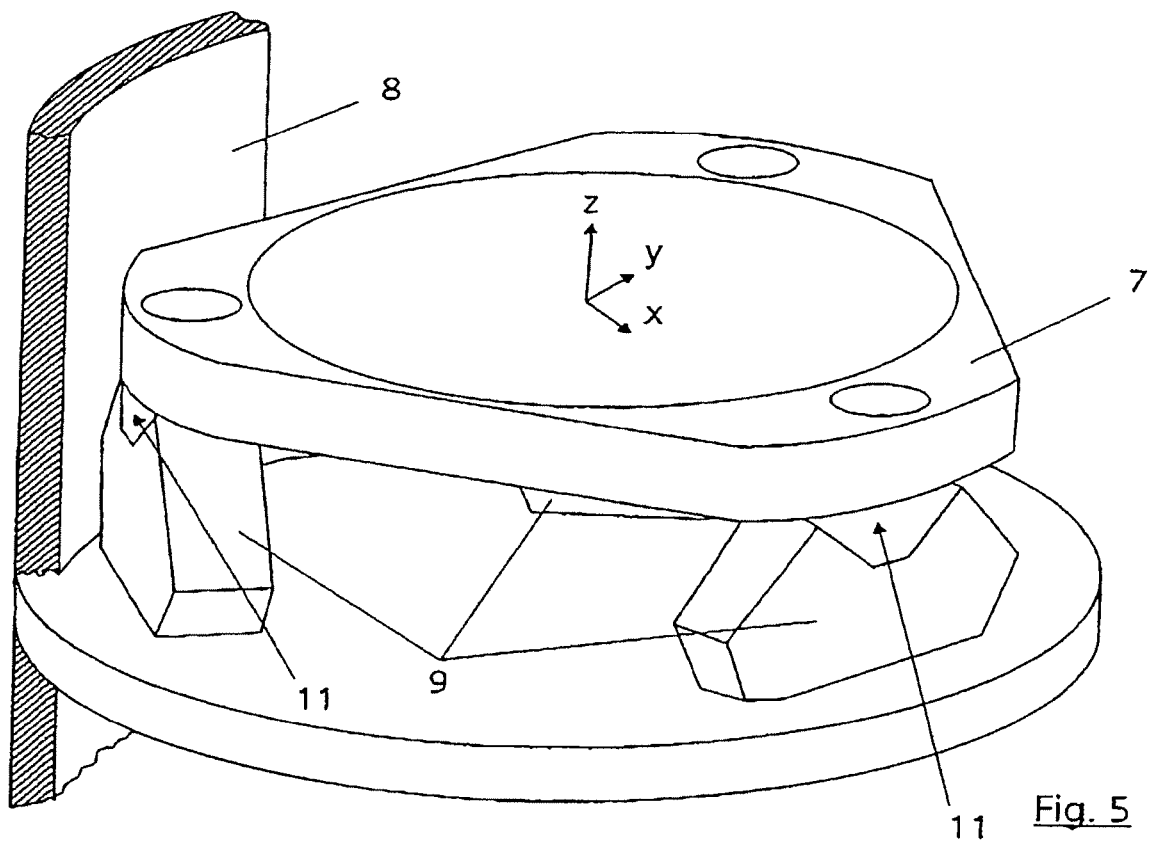
FIG. 5 shows a perspective view of the apparatus according to the invention for mounting a mirror.

FIG. 2 shows, in a simplified form, the manipulation of a mirror 7 with the aid of three actuator devices 9 in six degrees of freedom. The actuator devices 9 have force-controlled Lorentz actuators 10, that is to say actuators which are controlled via a force control loop, and which each allow one degree of freedom. The actuator devices 9 are connected to a structure (not illustrated in FIG. 2). As is illustrated in FIGS. 3, 4 and 5, by way of example, this may be the housing 8 of the projection objective 5 of the projection illumination system 1.

Figure 3:
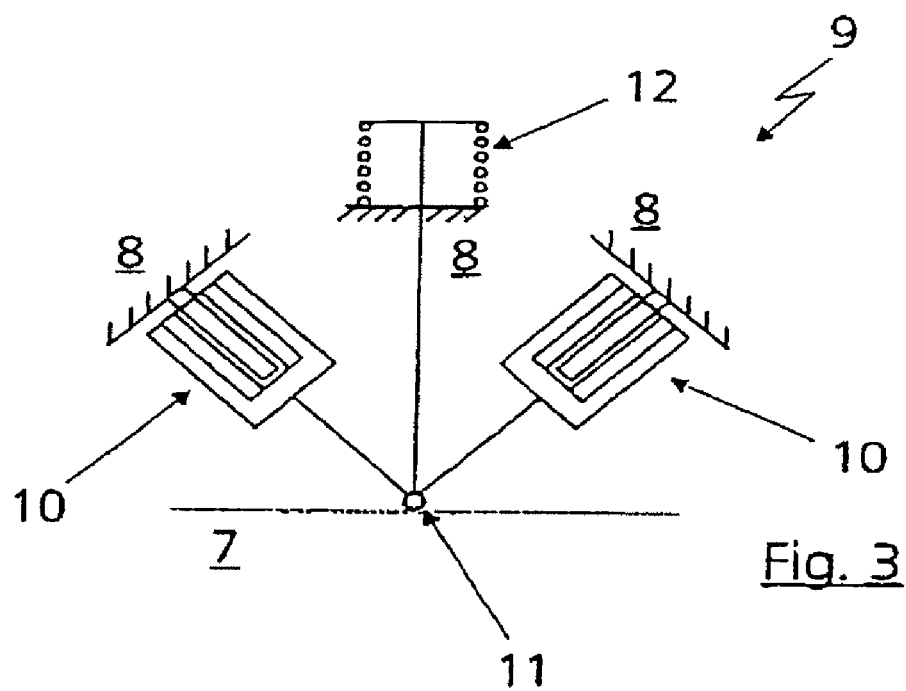
FIG. 3 shows a basic illustration of an actuator device.

FIG. 3 shows a basic illustration of the actuator device 9 with a linking point 11 to the mirror 7 and with the two links to the structure, that is to say to the housing 8 of the projection objective 5. The two Lorentz actuators 10 together support two degrees of freedom and are used for manipulation of the mirror 7. In order to minimize the energy consumption of the Lorentz actuators 10, the actuator device 9 additionally has a gravity compensation device 12, which is likewise linked to the housing 8, with a spring element 12 being used for this purpose in the present exemplary embodiment, as an opposing force element in order to compensate for the gravity force of the mirror 7. The forces which occur in the actuator device 9 are advantageously passed from the gravity compensation device 12 and the two Lorentz actuators 10 through a common point, thus minimizing the deformation of the optical surface of the mirror 7, in particular when moments occur.

The Lorentz actuators 10 are located on one plane and are at an angle of 90° to one another. The direction of the effective force of the gravity compensation device 12 in the present exemplary embodiment is parallel to the gravity force, and the Lorentz actuators 10 are located symmetrically on both sides of the gravity compensation device 12. In other exemplary embodiments, for example in the case of an obliquely arranged mirror 7, the actuator device 9 need not necessarily be symmetrical.

The linking point 11 in another exemplary embodiment could also be mechanically decoupled from the mirror 7 (for example by force coupling by means of magnetic forces).

Figure 7:
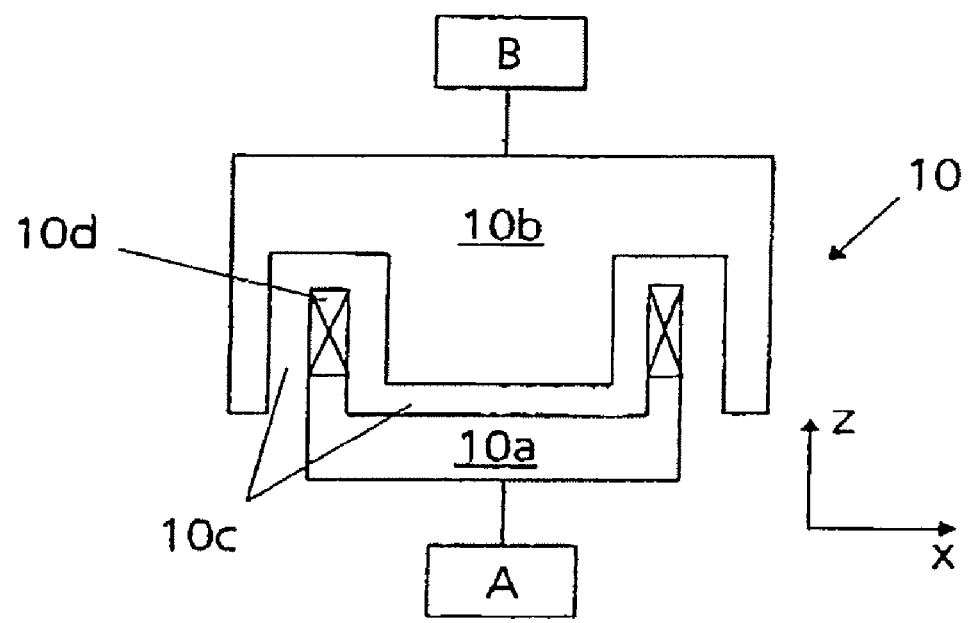
FIG. 7 shows schematically a force controlled actuator.

FIG. 7 shows schematically a force-controlled actuator according to the present invention. The actuator 10 comprises a first element 10a and a second element 10b. The elements 10a, 10b are movable relative to each other. Both elements 10a, 10b are connected to parts A and B, wherein at the application of the present invention one part is an optical element and the other part is a structure like a housing. The first and second elements 10a, 10b are mechanically decoupled such that only a gas or vacuum is between the both elements in the gap 10c. Preferably one element of the elements 10a, 10b comprises a solenoid 10d. If the solenoid 10d is subjected with an electrical current, the gap 10c or a part of the gap 10c is changed, and the elements 10a, 10b with the parts A, B are moved relative to each other. Preferably the gap 10c is dimensioned such that a movement of +/−300 micrometer is achievable in the direction x and/or z.

Figure 8:
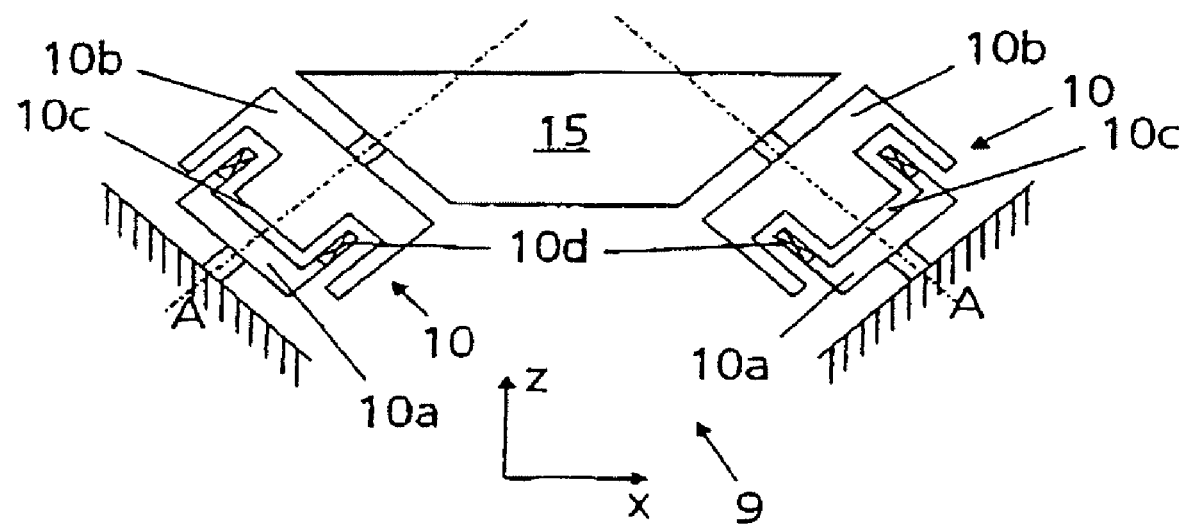
FIG. 8 shows schematically an actuator device similar as shown in FIG. 3 and FIG. 6.

FIG. 8 shows schematically two force-controlled actuators 10 of the same type, forming an actuator device 9 according to the present invention. Both actuators 10 are of the type as described in connection with FIG. 7, but they are mechanically coupled with a coupling element 15. In the shown embodiment one element 10a of each actuator 10 is connected to a base structure A, while the other element 10b of both actuators is connected to the coupling element 15. The gaps 10c of both actuators 10 are made such that e.g. a movement of about +/−300 micrometer for the coupling element is possible in an arbitrary direction within the xz-plane, such that there is no direct contact between the first and the second elements 10a and 10b of the respective actuators 10.

If the actuator according to FIG. 7 is a Lorentz actuator, the force of the actuator of FIG. 7 acts in the direction of z. Usually a bearing is necessary such the moveable element, say element 10b, is fixed within the yz-plane, the plane perpendicular to the direction of movement. The bearing according to the present invention is not mechanical, since the first and the second elements 10a, 10b of the force-controlled actuator 10 are mechanically decoupled. The bearing preferably is electromagnetic or magnetic.

At the actuator device 9 of FIG. 8 the bearing of the coupling element 15 (which itself could be an optical element) in the xz-plane (the plane defined by the forces of the two force-controlled actuators, forming the actuator device) is done by magnetic bearing if both actuators are of Lorentz type, e.g. as described in connection with FIG. 7. However, there is no bearing in the yz-plane (the plane perpendicular to the plane defined by the forces of the two force-controlled actuators, forming the actuator device) except if bearing magnets are also used for this direction. Then the first and the second elements 10a, 10b of the force-controlled actuators 10 are mechanically decoupled. Alternative or in addition to the magnetic bearing in the yz-plane a third force-controlled actuator may be connected to the coupling element 15. This third actuator is arranged in a plane other than the xz-plane (the plane defined by the forces of the two force-controlled actuators, forming the actuator device). With such an arrangement a coupling element (which can be an optical element) can be held without mechanical bearing, and can be moved in five degrees of freedom.

FIG. 4 shows a simplified plan view of a bearing according to the invention for the mirror 7 in the housing 8 of the projection objective 5. The mirror 7 is manipulated by means of three actuator devices 9, each having two degrees of freedom, relative to the housing 8. The actuator devices 9 are represented by dashed lines since, as can be seen from FIG. 5, they are arranged underneath the mirror 7. The actuator devices 9 are arranged distributed at uniform intervals of 120° around the circumference of the mirror 7. The three planes which are covered by the respective force-controlled actuators 10 of one of the actuator devices 9 are preferably but not necessarily parallel to the gravity force and, when seen in the plan view, form a triangle (indicated by the dashed extensions to the actuator devices 9 in FIG. 4). The actuator devices are preferably formed as described in connection with FIG. 8.

FIG. 5 shows a perspective view of the apparatus shown in FIG. 4. The plane which is covered by the linking points 11 of the actuator devices 9 advantageously lies on the neutral plane of the mirror 7, thus reducing deformations in the mirror surface. In this embodiment, using three actuator devices for the bearing of the optical element 7, there is advantageously no mechanical coupling or connection between the fixed elements and the movable elements of the force controlled actuators. Further, it is important to mention that in the embodiment of FIG. 4, using three actuator devices 9, there is almost no rigidity and damping except there is rigidity into the direct of the forces of the force-controlled actuator devices 9.

Figure 6:
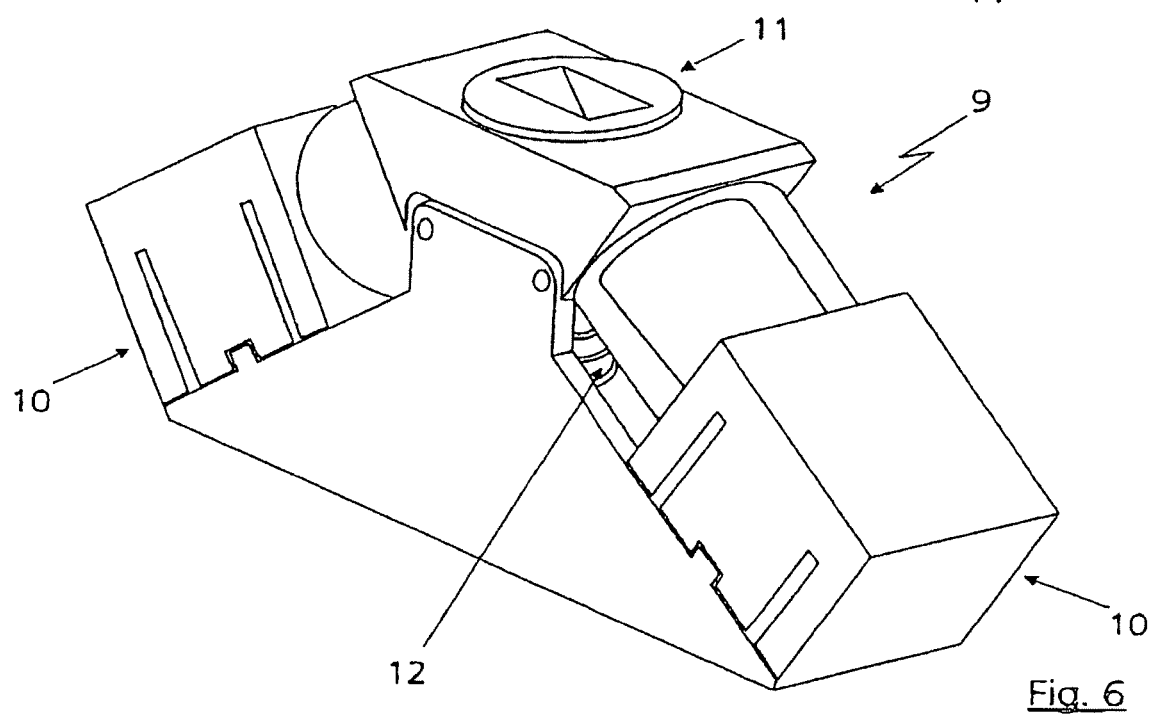
FIG. 6 shows a perspective view of an actuator device.

FIG. 6 shows a perspective view of an actuator device 9 with the Lorentz actuators 10 and with the gravity compensation spring 12. The actuator device 9 is connected to the mirror 7 at the linking point 11 (see FIG. 4). The linking point 11 may be formed on a coupling element 15 as described in connection with FIG. 8.

In addition, the position of the mirror 7 is determined by means of sensors (not illustrated).

A passive substitute module can be used during the manufacturing phase in order to make it possible to design the mirror 7 under the same force relationships as during subsequent operation, in order to make it possible to provide compensation for the mirror deformation resulting from the gravity force (not illustrated).

What is claimed is:

1. An EUV lithographic projection objective, comprising:
a body;
an optical element; and
at least three Lorentz actuators connected to the body of the EUV lithographic projection objective, the Lorentz actuators being configured to manipulate the optical element with respect to the body of the EUV lithographic projection objective,
wherein each Lorentz actuator comprises a first element that is connected to the body of the EUV lithographic projection objective and is fixed in at least one direction relative to the body of the EUV lithographic projection objective and a second element that is connected to the optical element and is movable in the at least one direction relative to the body of the EUV lithographic projection objective, the first and second elements are mechanically decoupled such that the first and second elements are separated from one another by a gap, and each Lorentz actuator is configured to generate a force in one direction, and wherein:
two of the Lorentz actuators are arranged in a first plane defined by the respective force directions of those two Lorentz actuators, thereby forming an actuator device that comprises a linking point to the optical element and two links to the body of the EUV lithographic projection objective, and a third of the Lorentz actuators is arranged in a plane different from the first plane, and
the actuator device further comprises a gravity compensation device configured to compensate gravity forces that act on the optical element.

2. The EUV lithographic projection objective of claim 1, wherein the gap between the first and second elements of each of the two Lorentz actuators forming the actuator device is dimensioned to allow the first and second elements of the two Lorentz actuators to move about +/−300 micrometers relative to each other within the first plane.

3. The EUV lithographic projection objective of claim 1, wherein the EUV lithographic projection objective comprises six Lorentz actuators, the six Lorentz actuators of the EUV lithographic projection objective forming three actuator devices, each actuator device comprising two Lorentz actuators.

4. The EUV lithographic projection objective of claim 3, wherein the actuator devices are configured to manipulate the optical element in six degrees of freedom.

5. The EUV lithographic projection objective of claim 3, wherein each of the six Lorentz actuators comprises a first element that is connected to the body of the EUV lithographic projection objective and is fixed in at least one direction relative to the body of the EUV lithographic projection objective and a second element that is connected to the optical element and is movable relative to the body of the EUV lithographic projection objective, and the first and second elements are mechanically decoupled such that the first and second elements are separated from one another by a gap.

6. The EUV lithographic projection objective of claim 3, wherein the actuator devices are arranged at uniform intervals around the circumference of the optical element.

7. The EUV lithographic projection objective of claim 3, wherein each actuator device comprises a linking point to the optical element and two links to the body of the EUV lithographic projection objective.

8. The EUV lithographic projection objective of claim 7, wherein the gap between the first and second elements of each of the Lorentz actuators is dimensioned to allow the first and second elements of the Lorentz actuators to move about +/−300 micrometers relative to each other within the first plane.

9. The EUV lithographic projection objective of claim 3, wherein the Lorentz actuators have substantially no rigidity between their first and second elements except in the one direction of their force.

10. The EUV lithographic projection objective of claim 3, wherein the Lorentz actuators of each actuator device are of the same type and are arranged in a plane at an angle of approximately 60° to approximately 120° relative to one another.

11. The EUV lithographic projection objective of claim 1, wherein the Lorentz actuators of the actuator device are of the same type.

12. The EUV lithographic projection objective of claim 11, wherein the second elements of the Lorentz actuators of the actuator device are connected to the optical element via a coupling element.

13. The EUV lithographic projection objective of claim 12, wherein the second element of the third Lorentz actuator is coupled to the optical element by the coupling element.

14. The EUV lithographic projection objective of claim 11, wherein the second elements of the Lorentz actuators of the actuator device are directly connected to the optical element.

15. The EUV lithographic projection objective of claim 14, wherein the second element of the third Lorentz actuator is directly connected to the optical element.

16. The EUV lithographic projection objective of claim 1, wherein the second element of each of the Lorentz actuators is connected to the optical element via a coupling element.

17. The EUV lithographic projection objective of claim 1, wherein the second element of each of the Lorentz actuators is directly connected to the optical element.

18. The EUV lithographic projection objective of claim 1, wherein the Lorentz actuators have substantially no rigidity between their first and second elements except in the one direction of their force.

19. The EUV lithographic projection objective of claim 1, wherein one of the first and second elements of each Lorentz actuator comprises a solenoid configured to move the first and second elements relative to one another when an electrical current is supplied to the solenoid.

20. The EUV lithographic projection objective of claim 1, wherein the body comprises a housing of the EUV lithographic projection objective.

21. The EUV lithographic projection objective of claim 1, wherein the body comprises a sensor frame of the EUV lithographic projection objective.

22. The EUV lithographic projection objective of claim 1, wherein the Lorentz actuators are configured to manipulate the optical element in at least five degrees of freedom with respect to the body of the EUV lithographic projection objective.

23. An EUV projection illumination system comprising the EUV lithographic projection objective of claim 1.

24. An EUV lithographic projection objective, comprising:
a body;
an optical element; and
three actuator devices connected to the body of the EUV lithographic projection objective, the actuator devices being configured to manipulate the optical element in up to six degrees of freedom with respect to the body of the EUV lithographic projection objective,
wherein each actuator device comprises a linking point to the optical element and three links to the body of the EUV lithographic projection objective, each actuator device comprises three Lorentz actuators, and each Lorentz actuator comprises a first element that is connected to the body of the EUV lithographic projection objective and is fixed in at least one direction relative to the body of the EUV lithographic projection objective and a second element that is connected to the optical element and is movable in the at least one direction relative to the body of the EUV lithographic projection objective, and the first and second elements are mechanically decoupled such that the first and second elements are separated from one another by a gap.

25. The EUV lithographic projection objective in accordance to claim 24, wherein the actuator devices are arranged at uniform intervals around the circumference of the optical element.

26. The EUV lithographic projection objective of claim 24, wherein the gap between the first and second elements of each of the Lorentz actuators is dimensioned to allow the first and second elements of the Lorentz actuators to move about +/−300 micrometer relative to each other within a plane defined by the one linking point and the two links of the actuator device.

27. The EUV lithographic projection objective of claim 24, wherein each actuator device further comprises a gravity compensation device configured to compensate gravity forces that act on the optical element.

28. The EUV lithographic projection objective of claim 24, wherein the body comprises a housing of the EUV lithographic projection objective.

29. The EUV lithographic projection objective of claim 24, wherein the second element of each of the Lorentz actuators is connected to the optical element via a coupling element.

30. The EUV lithographic projection objective of claim 24, wherein the second element of each of the Lorentz actuators is directly connected to the optical element.

31. An EUV projection illumination system comprising the EUV lithographic projection objective of claim 24.

32. The EUV lithographic projection objective of claim 1, wherein the EUV projection objective comprises an actuator device, and the actuator device comprises the at least three Lorentz actuators.

33. The EUV lithographic projection objective of claim 1, further comprising a second actuator device.

34. The EUV lithographic projection objective of claim 33, wherein the second actuator device further comprises a second gravity compensation device configured to compensate gravity forces that act on the optical element.

35. The EUV lithographic projection objective of claim 34, further comprising a third actuator device.

36. The EUV lithographic projection objective of claim 35, wherein the third actuator device further comprises a third gravity compensation device configured to compensate gravity forces that act on the optical element.

* * * * *

UNITED STATES PATENT AND TRADEMARK OFFICE
CERTIFICATE OF CORRECTION

| | | |
|---|---|---|
| PATENT NO. | : 8,179,621 B2 | Page 1 of 1 |
| APPLICATION NO. | : 12/716357 | |
| DATED | : May 15, 2012 | |
| INVENTOR(S) | : Michael Muehlbeyer | |

It is certified that error appears in the above-identified patent and that said Letters Patent is hereby corrected as shown below:

On the Title Page:
Item (56) References Cited:

<u>Page 2, Col. 2 (Other Publications),</u>
Line 2, delete "Piezo-Univeristy;" and insert --Piezo-University;--

<u>Page 2, Col. 2 (Other Publications),</u>
Line 3, delete "PI)Phisik" and insert --PI) Physik--

In the Specifications:

<u>Column 1,</u>
Line 47, delete "article," and insert --article--

<u>Column 2,</u>
Line 65, delete "currant." and insert --current.--

<u>Column 3,</u>
Lines 43-45, delete "Further, according to......claim 33."

Signed and Sealed this
Thirty-first Day of July, 2012

David J. Kappos
*Director of the United States Patent and Trademark Office*